United States Patent
Draves et al.

(10) Patent No.: US 6,380,757 B1
(45) Date of Patent: Apr. 30, 2002

(54) START PULSE REJECTION FOR A MOTOR COMMUTATION PULSE DETECTION CIRCUIT

(75) Inventors: Kenneth George Draves, Russiaville; Paul M. Werking, Tipton, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/586,802

(22) Filed: Jun. 5, 2000

(51) Int. Cl.[7] ............................................. G01R 31/34
(52) U.S. Cl. ........................................ 324/772; 318/254
(58) Field of Search ................................ 324/772, 158.1, 324/510, 511; 318/254, 258, 261, 294, 603, 293, 608; 388/907.2, 907.5, 909; 340/648

(56) References Cited

U.S. PATENT DOCUMENTS

| | | | |
|---|---|---|---|
| 5,075,607 A | * 12/1991 | Koharagi et al. | ............ 318/254 |
| 5,132,602 A | 7/1992 | Jorgenson | .................... 318/608 |
| 5,514,977 A | 5/1996 | Agiman | ...................... 324/772 |
| 5,572,100 A | * 11/1996 | Moulton | ...................... 318/434 |
| 6,078,154 A | * 6/2000 | Manlove et al. | ............. 318/293 |
| 6,262,546 B1 | * 7/2001 | Draves et al. | ............... 318/293 |

* cited by examiner

*Primary Examiner*—Michael J. Sherry
*Assistant Examiner*—Minh N. Tang
(74) *Attorney, Agent, or Firm*—Stefan V. Chmielewski

(57) ABSTRACT

Improved motor position detection circuitry based on commutation pulse counting, including a pulse recognition circuit, a pulse counting circuit, and a start pulse rejection circuit for rendering the position detection circuitry insensitive to start-up pulses associated with motor turn-on. The start pulse rejection circuit detects an off-to-on transition of a motor controller, and renders the position detection circuitry insensitive to start-up pulses generated in a predefined time window coinciding with the detected off-to-on transition. In a first mechanization, the start pulse rejection circuit maintains a nominal bias voltage at an input of the pulse recognition circuit for the duration of the predefined time window. In a second mechanization, the start pulse rejection circuit renders the pulse counting circuit insensitive to pulses produced by the pulse recognition circuit for the duration of the predefined time window.

5 Claims, 1 Drawing Sheet

START PULSE REJECTION FOR A MOTOR COMMUTATION PULSE DETECTION CIRCUIT

TECHNICAL FIELD

This invention relates to circuitry for determining the position of a motor driven actuator by identifying and counting motor commutation pulses.

BACKGROUND OF THE INVENTION

It is frequently desired, either for control or diagnostic purposes, to detect the position of a motor driven actuator, such as a movable door in an automotive air conditioning duct. In applications where the actuator is driven by a brush-type DC motor, the actuator position may be reliably and inexpensively determined by detecting and counting pulses in the motor current caused by the periodic commutation of motor current by the motor brushes. In general, the pulses are extracted by filtering, amplified, and then counted to form a count corresponding to the actuator/motor position.

Several different pulse detection circuits have been proposed. For example, the U.S. Pat. No. 5,514,977 references a circuit having a resistive shunt connected in series with the motor. In such case, the voltage at a node of the resistive shunt is capacitively coupled to a filter circuit.

A potential for error exists in the above-described circuits due to a sudden voltage rise in the motor drive circuit wires at motor turn on. Specifically, the sudden voltage rise results in a detected pulse (referred to herein as a start-up pulse) that may be mistaken for a commutation pulse, resulting in a motor position indication error. Accordingly, what is needed is a simple detection circuit that rejects start-up pulses, but that reliably detects all commutation pulses.

SUMMARY OF THE INVENTION

The present invention is directed to improved motor position detection circuitry based on commutation pulse counting, the circuitry including a pulse recognition circuit, a pulse counting circuit, and a start pulse rejection circuit for rendering the position detection circuitry insensitive to start-up pulses associated with motor turn-on. The start pulse rejection circuit detects an off-to-on transition of a motor controller, and renders the position detection circuitry insensitive to start-up pulses generated in a predefined time window coinciding with the detected off-to-on transition.

According to a first embodiment, the start pulse rejection circuit maintains a nominal bias voltage at an input of the pulse recognition circuit for the duration of the predefined time window. According to a second embodiment, the start pulse rejection circuit renders the pulse counting circuit insensitive to pulses produced by the pulse recognition circuit for the duration of the predefined time window.

DESCRIPTION OF THE PREFERRED EMBODIMENT

Figure 1:
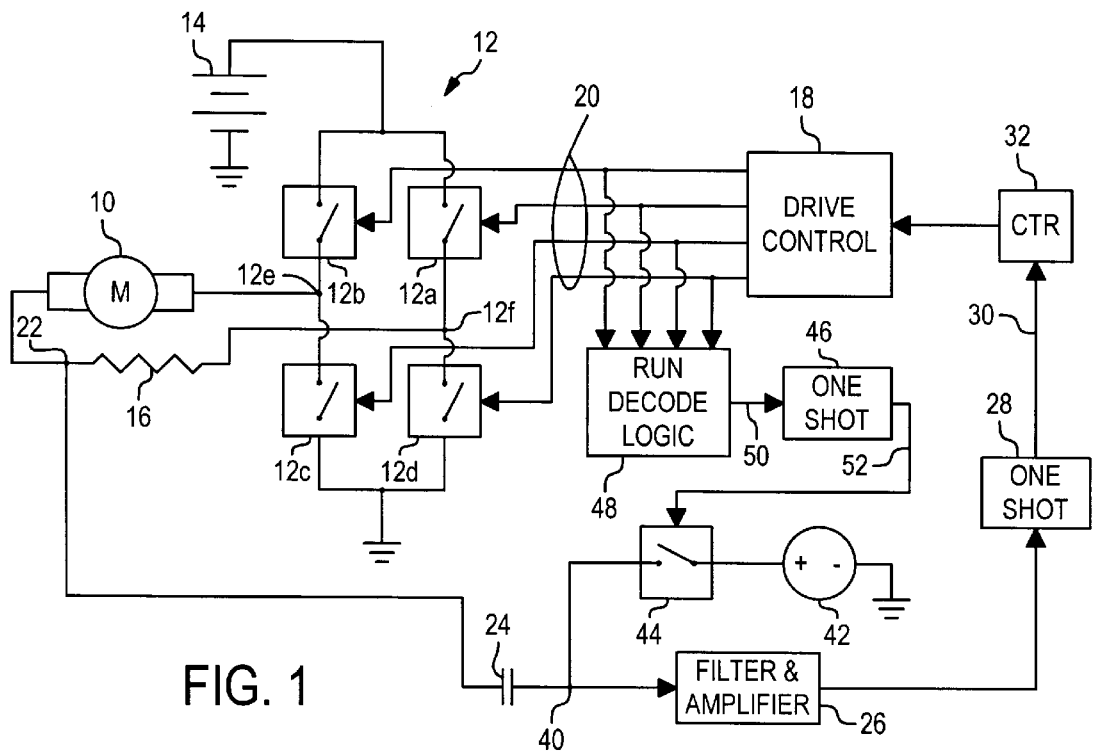
FIG. 1 is a block diagram of a motor commutation pulse detection circuit according to a first embodiment of this invention.
Figure 2:
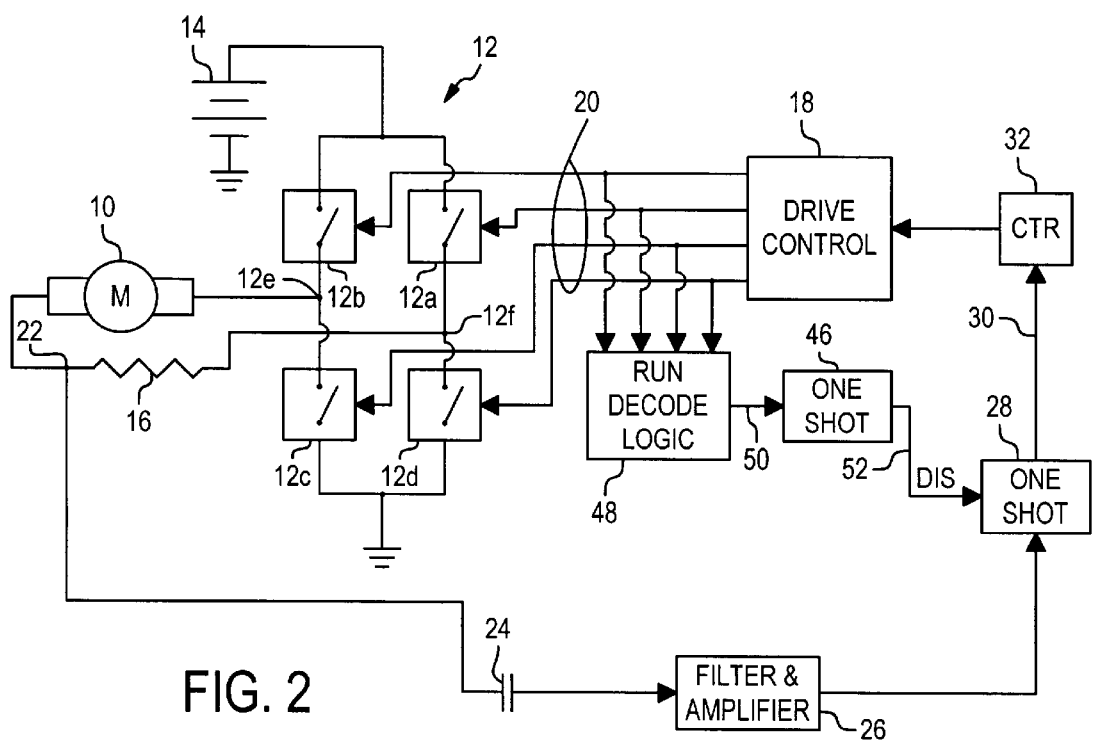
FIG. 2 is a block diagram of a motor commutation pulse detection circuit according to a second embodiment of this invention.

FIGS. 1–2 depict the present invention in the context of a known pulse count detection circuit in which a brush-type DC motor (M) 10 is coupled to a motor drive circuit generally designated by the reference numeral 12 and comprising a number of switch elements 12a, 12b, 12c, 12d connected in a bridge configuration. One end of the motor drive circuit 12 is connected to the positive terminal of a DC source such as battery 14, the other end is connected to the negative terminal of battery 14 (ground). The motor 10 and series connected resistor 16 are connected to the bridge nodes 12e and 12f. A drive control circuit 18 controls the switch elements 12a–12d via lines 20 to control motor energization. For example, forward motor rotation may be achieved by activating (closing) the switch elements 12a and 12c, and reverse motor rotation may be achieved by activating the switch elements 12b and 12d. Motor braking may be produced in one of two ways: by closing switch elements 12a and 12b, or by closing switch elements 12c and 12d. In all cases, the current passing through motor 10 also passes through the sense resistor 16, and a voltage is produced at a node 22 between motor 10 and resistor 16 according to the product of the motor current and the resistance of resistor 16.

Commutation pulses in the motor current produce corresponding voltage pulses at node 22, which are AC coupled to filter and amplifier circuit 26 via capacitor 24. The circuit 26 recognizes, passes and amplifies pulses in a frequency range characteristic of commutation pulses, and applies such pulses as an input to one-shot circuit 28, which produces a corresponding series of standard (squared) pulses on line 30. A pulse counter 32 counts the pulses on line 30, and the count stored in counter 32 represents the position of motor 10. As shown, the stored count may be applied as a position feedback signal to drive control circuit 18 for motor position control purposes.

As indicated, the above-described circuit is susceptible to error associated with a sudden voltage rise in drive control output lines 20 and drive circuit 12 at motor turn on. The error occurs because the sudden voltage rise results in the generation of a start-up pulse at node 22 that is coupled to filter and amplifier 26 via capacitor 24, and erroneously identified as a commutation pulse. As a result, the one-shot 28 is triggered, and the pulse counter 32 is erroneously incremented, causing the stored count to mis-indicate the motor position.

The present invention prevents the start-up pulse problem by essentially rendering the pulse count circuitry insensitive to pulses in a predefined time window coinciding with the generation of motor turn-on control signals by the drive control circuit 18. Alternate embodiments of the invention are depicted in FIGS. 1 and 2.

Referring to FIG. 1, the first embodiment of this invention includes circuitry for rendering the filter and amplifier circuit 26 insensitive to motor start pulses. Due to internal biasing, the input node 40 of the filter and amplifier circuit 26 is maintained at a nominal DC bias voltage with respect to ground in the absence of pulses coupled to node 40 by capacitor 24. A similar bias voltage defined by the voltage source 42 that is also referenced to ground potential is coupled to the node 40 when the switch element 44 is closed. The switch element 44 is controlled by one-shot 46, which in turn, is controlled by a run decode logic circuit 48. The run decode logic circuit 48 monitors the logic levels present on the drive control output lines 20, decodes the existence of a run condition (forward or reverse motor rotation), and produces an output signal on line 50 whenever a motor run condition is commanded. The one-shot 46 is triggered by the leading edge of the motor run signal on line 50, creating a control pulse of predetermined duration on switch control line 52, and the switch element 44 is biased to a conductive (closed) state for the duration of the control pulse. Thus, at each off-to-on transition of motor 10, a control pulse is produced on line 52, and the voltage source 42 maintains the node 40 at the nominal input bias voltage of filter and amplifier circuit 26 for a predetermined duration. This effectively masks any voltage pulses present at node 22, rendering the filter and amplifier circuit 26 insensitive to a start-up pulse at node 22. When the control pulse on line 52 terminates, the switch element 44 returns to a non-conductive (open) state, and the filter and amplifier circuit 26 is once again sensitive to voltage pulses produced at node 22.

Referring to FIG. 2, the second embodiment of this invention includes circuitry for rendering the one-shot 28 insensitive to pulses produced at the output of filter and amplifier circuit 26. The run decode logic circuit 48 and one-shot 46 are identical to the corresponding circuits described above in reference to FIG. 1. In this case, however, the control pulse on line 52 is applied to a Disable (DIS) input of one-shot 28, disabling the one-shot 28 so long as the control pulse is present. When the control pulse on line 52 terminates, the one-shot 28 is once again sensitive to pulses produced at the output of filter and amplifier circuit 26.

In summary, the circuitry of this invention simply and effectively renders the pulse count circuitry insensitive to pulses produced at motor turn-on, ensuring that such pulses do not disturb the relationship between the commutation pulse count and the position of motor 10. While described in reference to the illustrated embodiments, it is expected that various modifications in addition to those mentioned above will occur to those skilled in the art. For example, the functionality of run decode logic circuit 48 may be included in the drive control circuit 18, or the control pulse on line 52 may be applied as an enable to the pulse counter 32 instead of the one-shot 28. Furthermore, any combination of the digital components (18, 28, 32, 46, 48) may be implemented by either dedicated hardware or a suitably programmed microprocessor. Obviously, other variations are also possible. Thus, it will be understood that circuits incorporating these and other modifications may fall within the scope of this invention, which is defined by the appended claims.

What is claimed is:

1. Position detection circuitry for a motor drive system including a DC motor and a drive control circuit for selectively coupling said DC motor to a power source, comprising:

a sensor responsive to a current through said DC motor for producing voltage pulses corresponding to pulses in such current;

a pulse recognition circuit coupled to said sensor for filtering and amplifying voltage pulses received at a pulse recognition circuit input;

a pulse counting circuit responsive to filtered and amplified pulses produced by said pulse recognition circuit, for forming standard pulses in coincidence with the filtered and amplified pulses, and counting such standard pulses to provide a pulse count representative of motor position; and a start pulse rejection circuit responsive to an output of said drive control circuit for rendering at least one of the pulse recognition circuit and the pulse counting circuit inoperative for a predetermined time interval upon the coupling of said DC motor to said power source so that start-up voltage pulses produced by said sensor upon the coupling of said DC motor to said power source do not affect said pulse count.

2. The position detection circuitry of claim 1, wherein said start pulse rejection circuit includes a run decode logic circuit responsive to said output of said drive control circuit for signaling off-to-on transitions of said DC motor, and a pulse generator for producing a control pulse having a duration corresponding to said predetermined time interval in response to a signaled off-to-on transition of said DC motor by said run decode logic circuit.

3. The position detection circuitry of claim 1, wherein said pulse recognition circuit input is biased to a nominal DC bias voltage when no voltage pulses are being received from said sensor, and said start pulse rejection circuit renders said pulse recognition circuit inoperative for said predetermined time interval by maintaining the pulse recognition circuit input at a DC voltage corresponding to said DC bias voltage.

4. The position detection circuitry of claim 3, wherein said start pulse rejection circuit comprises:

a run decode logic circuit responsive to said output of said drive control circuit for signaling off-to-on transitions of said DC motor;

a pulse generator for producing a control pulse having a duration corresponding to said predetermined time interval in response to a signaled off-to-on transition of said DC motor by said run decode logic circuit; and a switch element controlled by said control pulse to couple said DC voltage to said pulse recognition circuit input for said predetermined time interval.

5. The position detection circuitry of claim 1, wherein said start pulse rejection circuit comprises:

a run decode logic circuit responsive to said output of said drive control circuit for signaling off-to-on transitions of said DC motor;

a pulse generator for producing a control pulse having a duration corresponding to said predetermined time interval in response to a signaled off-to-on transition of said DC motor by said run decode logic circuit; and disable circuitry responsive to said control pulse for rendering the pulse counting circuit inoperative for said predetermined time interval.

* * * * *